US012615047B2

(12) United States Patent
Dao et al.

(10) Patent No.: US 12,615,047 B2
(45) Date of Patent: Apr. 28, 2026

(54) INPUT BUFFER CIRCUIT HAVING A SIGNAL SPLITTER AND COMBINER CIRCUIT

(71) Applicant: NXP USA, Inc., Austin, TX (US)

(72) Inventors: Chris C Dao, Pflugerville, TX (US); Andre Luis Vilas Boas, Austin, TX (US); Christopher Micielli, Austin, TX (US)

(73) Assignee: NXP USA, Inc., Austin, TX (US)

( * ) Notice: Subject to any disclaimer, the term of this patent is extended or adjusted under 35 U.S.C. 154(b) by 21 days.

(21) Appl. No.: 18/742,762

(22) Filed: Jun. 13, 2024

(65) Prior Publication Data

US 2025/0385675 A1    Dec. 18, 2025

(51) Int. Cl.
*H03K 19/0185* (2006.01)
*H03K 3/356* (2006.01)
*H03K 19/003* (2006.01)

(52) U.S. Cl.
CPC .............. *H03K 19/018521* (2013.01); *H03K 3/356113* (2013.01); *H03K 3/356165* (2013.01); *H03K 19/00315* (2013.01)

(58) Field of Classification Search
CPC ....... H03K 3/356113; H03K 3/356165; H03K 19/00315; H03K 19/018521
See application file for complete search history.

(56) References Cited

U.S. PATENT DOCUMENTS 6,084,430 A    7/2000 Wayner
6,346,829 B1    2/2002 Coddington

| | | |
|---|---|---|
| 6,980,032 B1 * | 12/2005 | Blankenship .. H03K 19/018521 |
| | | 326/83 |
| 7,495,483 B2 | 2/2009 | Kumar et al. |
| 8,947,131 B2 | 2/2015 | Lee |
| 8,975,929 B2 | 3/2015 | Kumar |
| 9,496,874 B2 | 11/2016 | Kim |
| 9,735,763 B1 * | 8/2017 | Chen .................. H03K 19/0175 |
| 10,700,683 B1 * | 6/2020 | Chen ........................ H03K 5/08 |
| 11,569,819 B1 | 1/2023 | Shah et al. |
| 2007/0210838 A1 | 9/2007 | Gupta et al. |
| 2021/0013873 A1 | 1/2021 | Chen et al. |

OTHER PUBLICATIONS

NXP Semiconductors: "Understanding Injection Current on NXP Automotive Microcontrollers," Document No. AN4731, Application Note: Rev. 2, Dec. 2017, pp. 1-23.

* cited by examiner

*Primary Examiner* — Patrick O Neill
(74) *Attorney, Agent, or Firm* — Joanna G. Geld

(57) ABSTRACT

An input circuit receives an input voltage and generates a digital output. A first signal splitter generates a lower signal which tracks the input voltage in a range of a first voltage level and a second voltage level and provides a first control signal based on the upper signal. A second signal splitter generates an upper signal which tracks the input voltage in a range of the second voltage level and a third voltage level and provides at least one control signal based on the upper signal. The third voltage level is greater than the second voltage level which is greater than the first voltage level. A level shifter receives the at least one control signal from the second signal splitter and provides a third control signal, and a combiner circuit generates the digital output as a logical combination of the first and third controls signals.

22 Claims, 3 Drawing Sheets

INPUT BUFFER CIRCUIT HAVING A SIGNAL SPLITTER AND COMBINER CIRCUIT

BACKGROUND

Field

This disclosure relates generally to integrated circuits, and more specifically, an input buffer circuit having a signal splitter and combiner circuit.

Related Art

The Safe Operating Area (SOA) of a device describes the maximum voltages across any two terminals of the device for the device to maintain reliable operation. In some cases, devices rated for lower voltages (referred to as low voltage or LV devices) are used in high voltage domains, typically when high speed and low area are required. In this situation, there are possibilities that SOA violations occur on the LV devices.

For example, in some applications, such as automotive applications, input/output (I/O) buffers need to transmit and receive data at a higher voltage (e.g. 3.3V) that what is supported by the LV devices (e.g. 1.8V). One solution to support elevated pad voltages is to use a resistive voltage divider to step the pad voltage down before going into a receiver. However, this results in an increase in pin leakage. Therefore, a need exists for an input buffer with improved operation which avoids the need for a resistive voltage divider.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an input signal path of an input buffer circuit is divided into a high input voltage domain (VIH) and a low input voltage domain (VIL), in which each domain permits independent voltage control and provides a set of corresponding control outputs. After the input signal path is split and controlled to achieve the desired VIH and VIL swings, a level shifter is used to down shift the VIH control outputs. The level shifted VIH control outputs are then combined with the VIL control outputs at a combiner which outputs corresponding digital input signal to internal circuitry having the appropriate voltage swing for the internal circuitry. The level shifter and combiner prevent SOA violations, thus protecting the LV devices.

Figure 1:
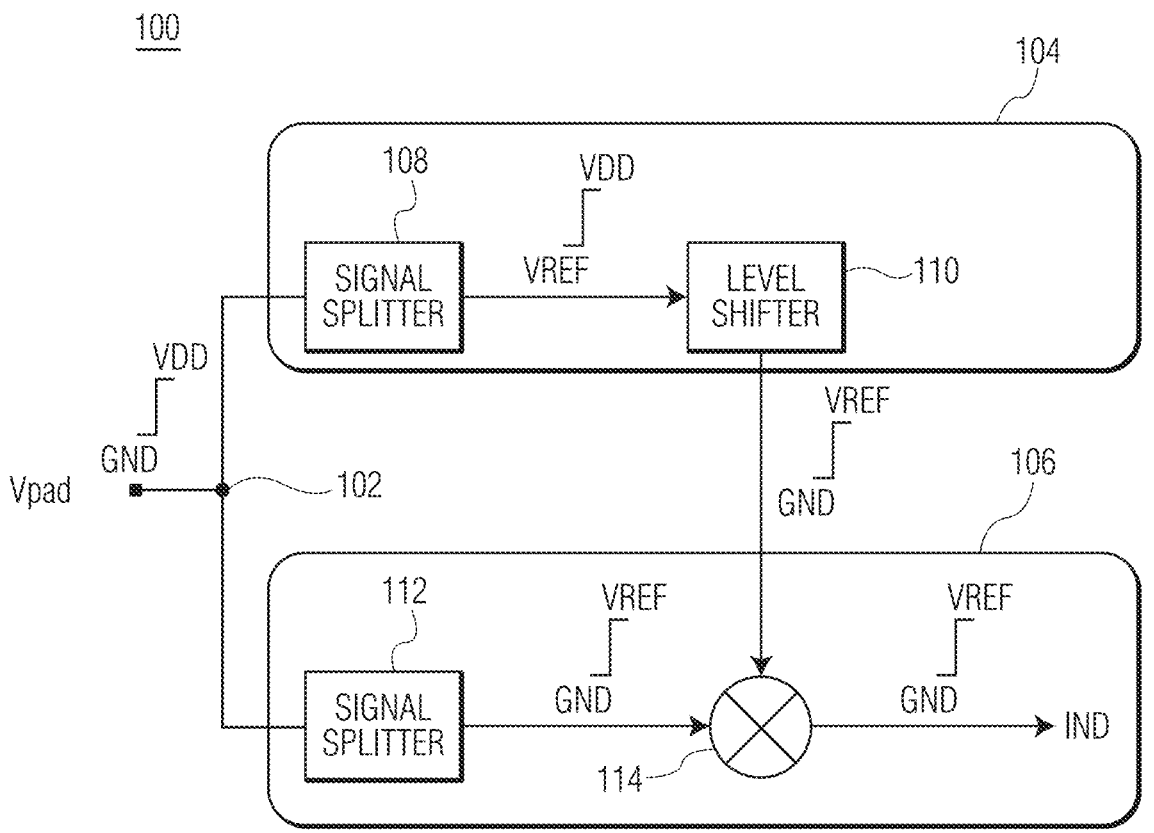
FIG. 1 illustrates, in block diagram form, an input buffer circuit, having a high input voltage domain (VIH) and a low input voltage domain (VIL), in accordance with one embodiment of the present invention.

FIG. 1 illustrates, in block diagram form, an input buffer circuit 100 (also referred to as an I/O input buffer circuit or simply as an input circuit), having high and low input voltage domains VIH 104 and a VIL 106, respectively, in accordance with one embodiment of the present invention. Input buffer circuit 100 includes an input circuit node 102 coupled to an input pad (i.e. input pin), which receives the input voltage, Vpad. Vpad is a voltage signal capable of swinging between a high supply voltage (VDD) and a low supply voltage (GND). In one embodiment, the high supply voltage (VDD) is provided by a first voltage supply terminal, and the low supply voltage (GND) is provided by a second voltage supply terminal. A reference voltage (VREF), which is between the high and low supply voltages, is provided by a third voltage supply terminal. In one example, VDD is 3.3V, GND is ground or 0V, and VREF is VDD/2, e.g., 1.65V. In alternate embodiments, the reference voltage can be a different intermediate voltage between the high and low supply voltages, such as 1.5V. Note that, for ease of description, each of the first, second, and third voltage supply terminals will simply be referred to by the voltage it supplies (e.g. VDD, GND, and VREF, respectively).

In operation, input buffer circuit 100 receives Vpad, which varies between VDD and GND (in which VDD corresponds to the maximum voltage level for Vpad) and provides a corresponding digital output data signal (IND) that varies between VREF and GND (in which VREF corresponds to the maximum voltage level for IND). That is, input buffer circuit 100 translates Vpad to IND such that, for example, when Vpad rises to higher than a first percentage of VDD (e.g. 70% VDD), IND is provided as a logic level high (VREF), and when Vpad falls to below a second percentage of VDD (e.g. 30% of VDD), IND is provided as a logic level low (GND). Note that alternate embodiments, based on how the comparators of input buffer circuit 100 are implemented, these first and second percentages for generating logic level ones and zeros for IND may differ. As used herein, a logic level high and logic level low may also be referred to as high and low, respectively, or as a logic level one and logic level zero, respectively. IND can be provided to any internal circuitry (such as logic circuitry with a system on chip (SoC)) in which the voltages of the internal circuitry cannot exceed VREF. VREF can therefore be set to supply a voltage which prevents SOA violations of any LV devices within the internal circuitry.

In the illustrated embodiment of FIG. 1, VIH 104 includes a signal splitter 108 and a level shifter 110, and VIL 106 includes a signal splitter 112 and a combiner circuit 114 (which may simply be referred to as a combiner). Signal splitter 112 and signal splitter 108 can be implemented as different portions of a circuit which splits the input voltage path for Vpad into different voltage ranges for their corresponding domain. For example, signal splitter 112 provides Vpad, when between GND and VREF, to a first input of combiner 114 (in VIL 104), and signal splitter 108 provides Vpad, when between VREF and VDD, to an input of level shifter 110 (in VIH 106). Level shifter 110 level shifts its output down to provide a second input of combiner 114 (in VIL 104), in which this second input, like the first input, also varies between GND and VREF. At the output of combiner 114, both inputs are logically combined to form IND which also varies between VREF and GND.

Figure 2:
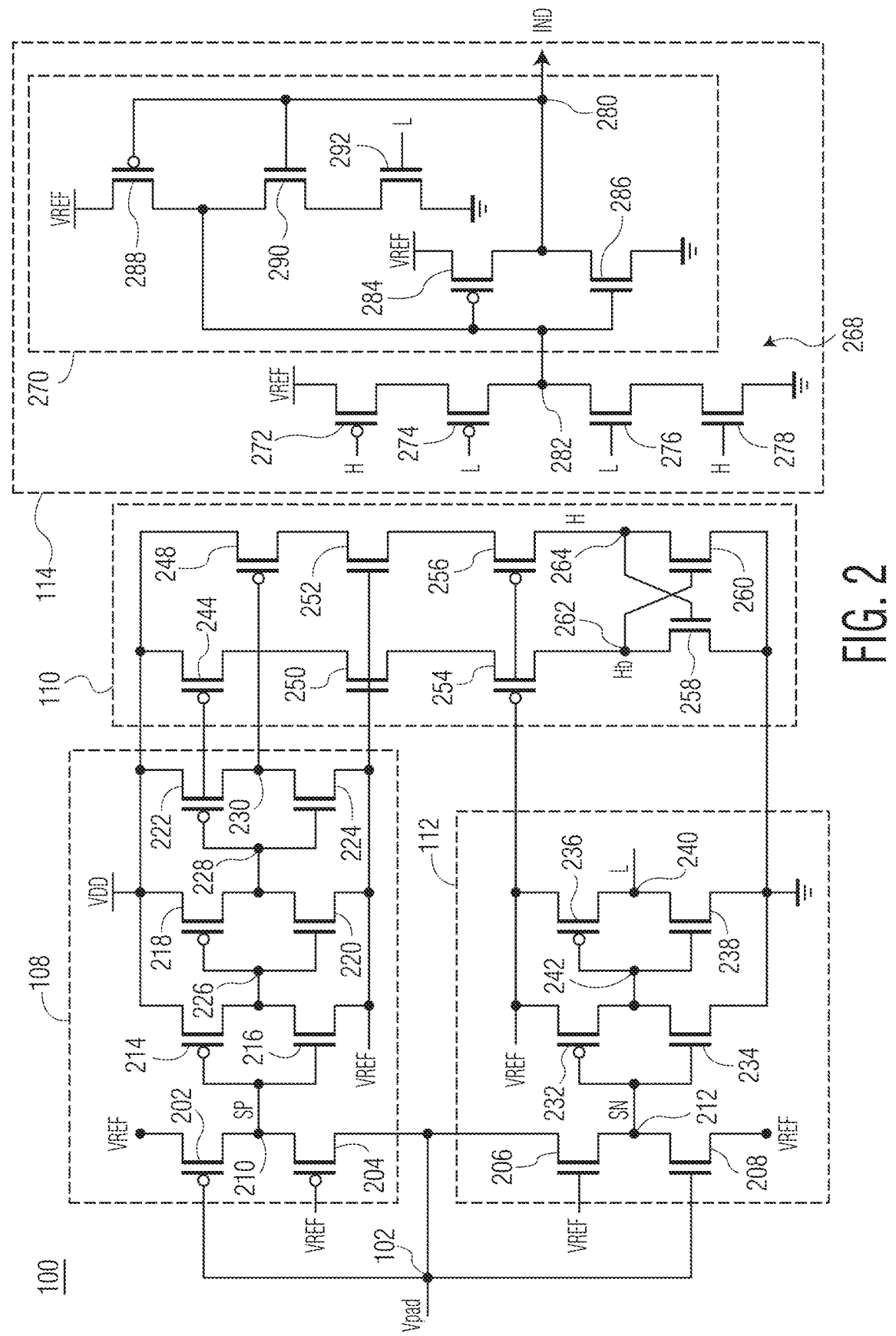
FIG. 2 illustrates, in schematic form, the input buffer circuit of claim 1, in accordance with one embodiment of the present invention.

FIG. 2 illustrates, in schematic form, a more detailed version of input buffer circuit 100, in accordance with one embodiment of the present invention. Referring first to signal splitter 108, signal splitter 108 includes p-channel metal-oxide semiconductor (PMOS) transistors 202, 204, 214, 218, and 222 and n-channel metal-oxide semiconductor (NMOS) transistors 216, 226, and 224. A first current electrode of transistor 202 is coupled to VREF, a control electrode of transistor 202 is coupled to receive Vpad, and a second current electrode of transistor 202 is coupled to a circuit node 210, which provides a voltage SP. A first current electrode of transistor 204 is coupled to node 210, a control electrode of transistor 204 is coupled to VREF, and a second current electrode is coupled to receive Vpad. Transistor 214 has a first current electrode coupled to VDD, a control electrode coupled to node 210 to receive SP, and a second current electrode coupled to a circuit node 226. Transistor 216 has a first current electrode coupled to node 226, a control electrode coupled to node 210 to receive SP, and a second current electrode coupled to VREF. Transistors 214 and 216 form a first inverter of splitter 108 (referred to as inverter 214/216) having an input at node 210 coupled to receive SP and an output at node 226.

Continuing with signal splitter 108, transistor 218 has a first current electrode coupled to VDD, a control electrode coupled to node 226 to receive the output of inverter 214/216, and a second current electrode coupled to a circuit node 228. Transistor 220 has a first current electrode coupled to node 228, a control electrode coupled to node 226, and a second current electrode coupled to VREF. Transistors 218 and 220 form a second inverter of splitter 108 (referred to as inverter 218/220) having an input at node 226 coupled to the output of inverter 214/216 and an output at node 228. Transistor 222 has a first current electrode coupled to VDD, a control electrode coupled to node 228 to receive the output of inverter 218/220, and a second current electrode coupled to a circuit node 230. Transistor 224 has a first current electrode coupled to node 230, a control electrode coupled to node 228, and a second current electrode coupled to VREF. Transistors 222 and 224 form a third inverter of splitter 108 (referred to as inverter 222/224) having an input at node 228 coupled to the output of inverter 218/220 and an output at node 230. Each of the first, second, and third inverters of splitter 108 is powered between VDD and VREF such that the output of each inverter only varies between VDD and VREF (unlike Vpad which varies between VDD and GND).

Referring next to signal splitter 112, signal splitter 112 includes NMOS transistors 206, 208, 234, and 238, and PMOS transistors 2323 and 236. A first current electrode of transistor 206 is coupled to Vpad, a control electrode of transistor 206 is coupled to VREF, and a second current electrode of transistor 206 is coupled to a circuit node 212, which provides a voltage SN. A first current electrode of transistor 208 is coupled to node 212, a control electrode of transistor 208 is coupled to Vpad, and a second current electrode is coupled to VREF. Transistor 232 has a first current electrode coupled to VREF, a control electrode coupled to node 212 to receive SN, and a second current electrode coupled to a circuit node 242. Transistor 234 has a first current electrode coupled to node 242, a control electrode coupled to node 212 to receive SN, and a second current electrode coupled to GND. Transistors 232 and 234 form a first inverter of splitter 112 (referred to as inverter 232/234) having an input at node 212 coupled to receive SN and an output at node 242.

Continuing with signal splitter 112, transistor 236 has a first current electrode coupled to VREF, a control electrode coupled to node 242 to receive the output of inverter 232/234, and a second current electrode coupled to a circuit node 240. Transistor 238 has a first current electrode coupled to node 240, a control electrode coupled to node 242, and a second current electrode coupled to GND. Transistors 236 and 238 form a second inverter of splitter 112 (referred to as inverter 236/238) having an input at node 242 coupled to the output of inverter 232/234 and an output at node 240 which is provides a first control signal, L. Each of the first and second inverters of splitter 112 is powered between VREF and GND such that the output of each inverter (including control signal L) only varies between VREF and GND (unlike Vpad which varies between VDD and GND).

Referring next to level shifter 110, level shifter 110 includes PMOS transistors 244, 248, 254, and 256 and NMOS transistors 250, 252, 258, and 260. Transistor 244 has a first current electrode coupled to VDD, a control electrode coupled to node 228 (to receive the output of inverter 218/220), and a second current electrode coupled to a first current electrode of transistor 250. Transistor 248 has a first current electrode coupled to VDD, a control electrode coupled to node 230 (to receive the output of inverter 222/224), and a second current electrode coupled to a first current electrode of transistor 252. Transistor 250 has a control electrode coupled to VREF, and transistor 252 has a control electrode coupled to VREF. Transistor 256 has a first current electrode coupled to a second current electrode of transistor 252, a control electrode coupled to VREF, and a second current electrode coupled to a circuit node 264 (which provides a second control signal, H). Transistor 254 has a first current electrode coupled to a second current electrode of transistor 250, a control electrode coupled to VREF, and a first current electrode coupled to a circuit node 262 (which provides an inverse of the second control signal, Hb, in which, as used herein, a "b" following a signal name indicates the inverse of that signal).

Continuing with level shifter 110, transistor 258 is cross-coupled with transistor 260. Transistor 258 has a first current electrode coupled to node 262, a control electrode coupled to node 264, and a second current electrode coupled to GND. Transistor 260 has a first current electrode coupled to node 264, a control electrode coupled to node 262, and a second current electrode coupled to GND.

Combiner 114 includes an input stage 268 configured to receive the control signal L from signal splitter 112 and control signal H from level shifter 110. Input stage 268 includes PMOS transistors 272 and 274 and NMOS transistors 276 and 278. Transistor 272 has a first current electrode coupled to VREF and a control electrode coupled to receive H. Transistor 274 has a first current electrode coupled to a second current electrode of transistor 272, a control electrode coupled to receive L, and a second current electrode coupled to a circuit node 282. Transistor 276 has a first current electrode coupled to node 282 and a control electrode coupled to receive L. Transistor 278 has a first current electrode coupled to a second current electrode of transistor 276, a control electrode configured to receive H, and a second current electrode coupled to GND. Combiner 114 also includes a weak latch circuit 270 which has an input coupled to node 282, provides IND at circuit node 280, and has a feedback path which provides an inverted version of IND back to the input at node 282. Latch 270 includes a PMOS transistor 284 having a first current electrode coupled to VREF, a control electrode coupled to node 282, and a first current electrode coupled to node 280, and an NMOS transistor 286 having a first current electrode coupled to node 280, a control electrode coupled to node 282, and a second current electrode coupled to GND. Transistors 284 and 286 form an inverter having an input coupled to node 282, and an output which provides IND at node 280 (and is referred to as inverter 284/286).

Continuing with combiner 114, latch 270 also includes a PMOS transistor 288 having a first current electrode coupled to VREF, a control electrode coupled to node 280, and a second current electrode coupled to node 282, an NMOS transistor 290 having a first current electrode coupled to the second current electrode of transistor 288 and a control electrode coupled to node 280, and an NMOS transistor 292 having a first current electrode coupled to a second current electrode of transistor 290, a control electrode coupled to receive L, and a second current electrode coupled to GND. Transistors 288 and 290 form an inverter (referred to as inverter 288/290) having an input coupled to node 280 to receive IND and an output coupled to node 282 to provide the inverted version of IND back to the input of inverter 284/286. Transistor 292 increases the resistance of the pull-down path of inverter 288/290 which slows down the falling edge at the output of inverter 288/290 based on L.

Figure 3:
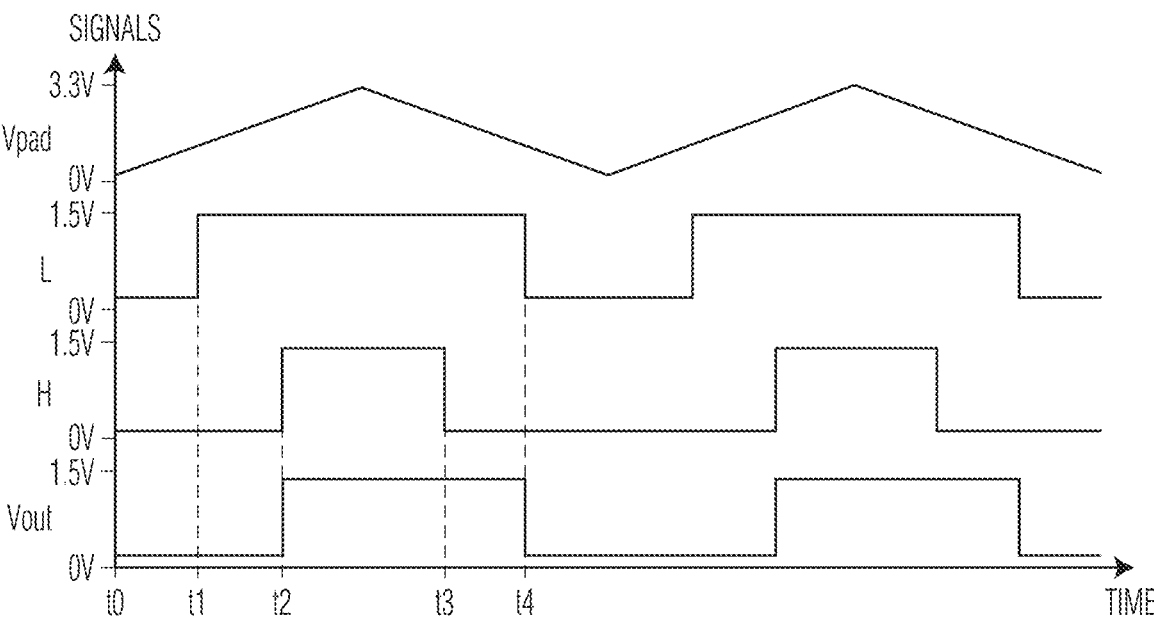
FIGS. 3 and 4 illustrate waveforms of various signals in the input buffer circuit of FIG. 2, in accordance with embodiments of the present invention.
Figure 4:
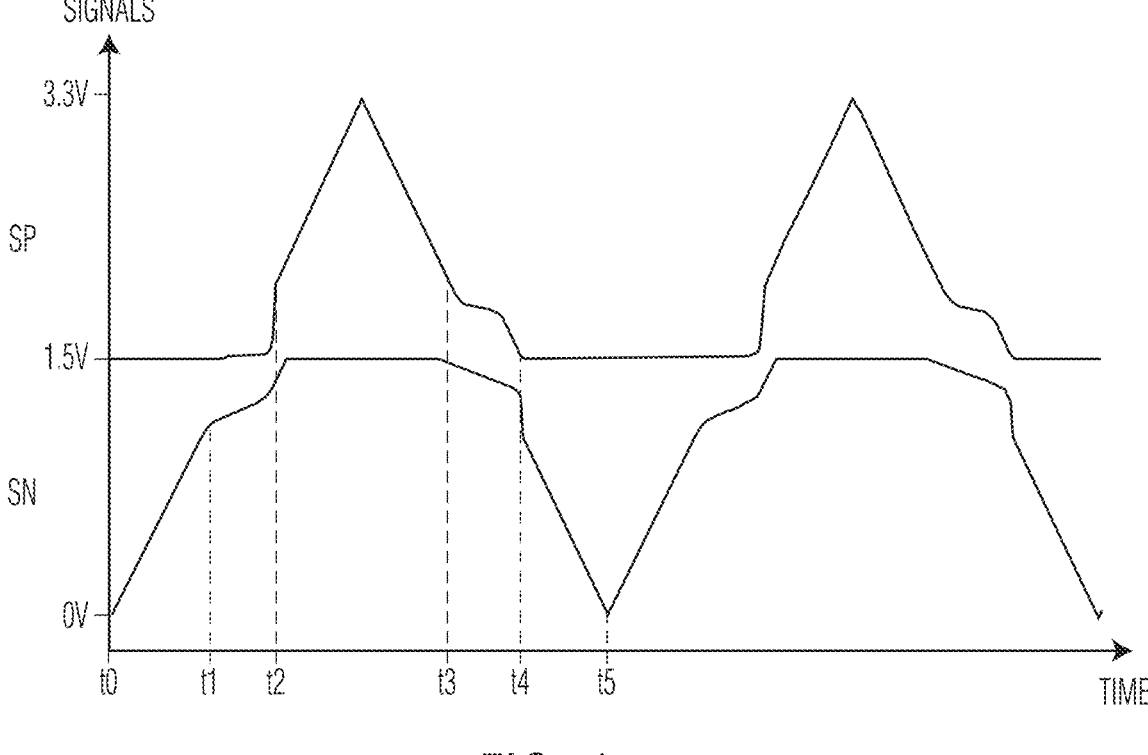

Operation of FIG. 2 will be described in reference to the waveforms of FIGS. 3 and 4, in which FIG. 3 illustrates waveforms for Vpad, control signals L and H, and IND, and FIG. 4 illustrates waveforms for SP and SN, in accordance with an embodiment of the present invention. The input stages of signal splitters 108 and 112 provide SN and SP, respectively, as illustrated in the waveforms of FIG. 4. For example, transistors 206 and 208 operate to select the lower voltage between Vpad and VREF (e.g. 1.5V) to provide as SN, while transistors 202 and 204 operate to select the higher voltage between Vpad and VREF to provide as SP. Therefore, while Vpad is less than or equal to VREF (e.g. time t0 to t1, t4 to t5) transistor 208 is off and SN tracks Vpad (while transistor 202 is on which maintains SP at VREF), and while Vpad is then greater than or equal to VREF (e.g. time t2 to t3), transistor 202 is off and SP tracks Vpad (while transistor 208 is on which maintains SN at VREF). In this manner, as illustrated by the waveforms of FIG. 4, Vpad is split into a lower signal in the range of GND to VREF (represented by SN) and an upper signal in the range of VREF to VDD (represented by SP).

SN and SP are provided to the chain of inverters of VIL 106 and the chain of inverters of VIH 104, respectively. The inverters of signal splitter 112, in VIL 106, operate as a comparator and may therefore be referred to collectively as a VIL comparator, while the inverters of signal splitter 108, in VIH 104, operate as a comparator and may therefore be referred to collectively as a VIH comparator. The trippoints of the inverters in each of the VIL and VIH comparators can be adjusted to control the VIL and VIH voltage levels. Also, the inverters of signal splitter 112 provides one or more control signals (e.g. outputs of inverter 218/220 and inverter 222/224) to level shifter 110, which provides H based on these one or more control signals.

The input voltage at Vpad is compared to the VIL and VIH voltage levels (trippoints) by comparing SN to the trippoint of inverter 232/234 and SP to the trippoint of inverter 214/216. As seen in FIG. 3, as Vpad rises from a logic low (e.g. 0V) at time t0 to a logic high (e.g. to 3.3V), Vpad (e.g. SN) will first trip the VIL comparator (corresponding to the trippoint of inverter 232/234) causing the output of inverter 232/234 to go low and thus control signal L at the output of inverter 236/238 to go high. Therefore, as illustrated in FIG. 3, at time t1 (once SN has triggered inverter 232/234 and the signal has propagated through inverter 236/238), L is asserted high (to a logic level one, corresponding to VREF).

As Vpad continues to rise past VREF, Vpad (e.g. SP) will next trip the VIH comparator (corresponding to the trippoint of inverter 214/216) causing the output of inverter 214/216 to go low. This propagates through the inverters such that the output of inverter 218/220 goes high to VDD (which turns off transistor 244) and the output of inverter 222/224 going low (which turns on transistor 248). With transistor 248 turning on, H is asserted high in which circuit node 264 is pulled to VREF (rather than VDD). That is, in response to Vpad tripping the VIH comparator, H is asserted at a logic level high at time t2 of FIG. 3 (note that due to level shifter 110, the asserted state at a logic level high for H is shifted from VDD down to VREF).

IND is generated as a logical combination of logic control signals H and L which are provided to input stage 268. Once both H and L are asserted at a logic level high (corresponding to "H AND L"), both transistors 276 and 278 are on, driving node 282 low (to GND). In response, the output of inverter 284/286 at node 280, corresponding to IND, goes to high (to a logic level one at VREF, as seen at time t2 of FIG. 3). IND is fed back via inverter 288/290 (when transistor 292 is also on) as a logic level zero to the input of inverter 284/286. This forms a latch which generates IND. In this manner (with transistor 292 on), even when node 282 is not yet driven high nor low (e.g. is at high impedance), IND remains defined at an appropriate logic level. Note that L is provided to transistor 292 which turns on transistor 292 (and thus enables inverter 288/290 to operate) once L is asserted high.

Note that when H and L are both negated (at zero), transistors 272 and 274 are both on, driving node 282 high to VREF, which generates IND as a logic level zero. Once L is asserted, inverter 288/290 is enabled to maintain IND at a logic level zero. Then once H is asserted as well, node 282 goes low and IND is generated as a logic level one. As Vpad drops back down to 0V, transistor 212/216 will be tripped first causing the output of inverter 214/216 to go high, which results in negating H (at time t3). This turns on transistor 272 and turns off transistor 278, but IND is still maintained high due to latch 270. As Vpad continues to drop, transistor 232/234 will then be tripped causing the output of inverter 232/234 to go high, which results in negating L (at time t4). With both H and L negated, IND is again negated to zero (and inverters 288/290 is again disabled). Therefore, as seen in FIG. 3, combiner 114 generates IND as going high once both H and L are asserted, and going low again once both H and L are negated.

Note that the trippoints of each of inverter 214/216 (for the VIH comparator) and inverter 232/234 (for the VIL comparator) can be separately adjusted, as needed, to correspond to the desired rising and falling edges of IND (such that rising edges occur at a desired first percentage of VDD while a falling edge occurs at a desired second percentage of VDD). Furthermore, note that the VIH and VIL comparators are independent such that altering or modifying the trippoint of the VIL comparator has no effect on the trippoint of the VIH comparator and vice versa. In this manner, the generation of the rising and falling edges of IND can be independently controlled to achieve the desired digital signal based on Vpad.

Therefore, it can be understood how the VIL comparator operates with inputs ranging from 0 to VREF (as provided by SN based on Vpad) and the VIH comparator operates with inputs ranging from VREF to VDD (as provided by SP based on Vpad), in which the output of the VIH comparator (H) is level shifted down to have the same voltage level as the VIL comparator output (L), before being combined by combiner 114 to generate IND. Since the inverters of VIH 104 and the inverters of VIL 106 (i.e. the VIH comparator and VIH comparator, respectively) are independently controlled, tweaking the inverters of VIH 104 has no effect on the inverters of VIL 106 and vice versa. In this manner, it may be guaranteed that the trippoint of the VIH comparator is always greater than the trippoint of the VIL comparator, even across process, voltage, and temperature (PVT) variations. The independence between the VIH and VIL comparators may also allow for lower variation in duty cycle across PVTs.

Note that current systems which use resistive dividers and simple inverters to combine a split input signal introduce interdependencies between the split domains, which may negatively impact the generation of IND, especially across PVT variations. Further, since interdependencies remain between the split domains of the current systems, even minor changes in the VIL comparator will affect the VIH comparator and vice versa. However, by splitting the domains and separately driving a VIH comparator and VIL comparator, and then level shifting the VIH comparator outputs prior to recombination at the backend to generate IND, the VIH and VIL comparators can remain independent of each other so that each can be independently adjusted to result in the proper generation of IND.

In alternate embodiments, additional or different circuits may be used to implement splitters 108 and 112 to split Vpad into the VIH and VIL domains, and additional or different circuitry may be used to implement each of the VIL and VIH comparators, as well as level shifter 110, to generate the corresponding control signals (e.g. L and H). Also, additional or different circuitry may be used to implement the logic function of combiner 114.

Note that in the illustrated embodiments, VREF is shared by VIH 104 and VIL 106 such that the signals generated by signal splitter 112 vary between GND and VREF and the signals generated by signal splitter 108 vary between VREF and VDD. In alternate embodiments, the VREF used as the lower voltage rail for the inverters of splitter 108 and as the higher voltage rail for the inverters of splitter 112 may differ (e.g. a different VREF, such as VREF', may instead be used as the lower voltage rail for the inverters of splitter 108, in which VREF' is also a voltage between VDD and GND).

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a "b" following the name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also for example, in one embodiment, the illustrated elements of system 100 are circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different latch designs can be used to implement weak latch 270 or to provide feedback in generating IND. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In an embodiment, an input circuit is configured to receive an input voltage and generate a digital output, and includes a first signal splitter configured to generate a lower signal which tracks the input voltage in a range of a first voltage level and a second voltage level and provide a first control signal based on the upper signal; a second signal splitter configured to generate an upper signal which tracks the input voltage in a range of the second voltage level and a third voltage level and provide at least one control signal based on the upper signal, wherein the third voltage level is greater than the second voltage level, and the second level is greater than the first voltage level; a level shifter configured to receive the at least one control signal from the second signal splitter and provide a third control signal; and a combiner circuit configured to generate the digital output as a logical combination of the first and third controls signals. In one aspect of the above embodiment, the first control and the third control signal each vary between the first and second voltage levels, and each of the at least one control signals varies between the second and third voltage levels. In another aspect, the combiner circuit includes a first, second, third, and fourth transistors coupled in series between first and second voltage supply terminals, wherein the first voltage supply terminal is configured to provide the second voltage level and the second voltage supply terminal is configured to provide the first voltage level, wherein each of the first, second, third, and fourth transistors is coupled to receive one of the first control signal or the third control signal. In a further aspect, the first and second transistors are coupled between the first voltage supply terminal and a circuit node, wherein the first and second transistors are p-channel transistors, wherein a current electrode of the first transistor is coupled to receive the one of the first control signal or third control signal and a current electrode of the second transistor is configured to receive another one of the first control signal or third control signal; the third and fourth transistors are coupled between the circuit node and the second voltage supply terminal, wherein the third and fourth transistors are n-channel transistors, wherein a current electrode of the fourth transistor is coupled to receive the one of the first control signal or third control signal and a current electrode of the third transistor is configured to receive the another one of the first control signal or third control signal; and the digital output signal is generated based on the circuit node. In yet a further aspect, the second transistor is coupled between the circuit node and the first transistor, and the current electrode of the second transistor is coupled to receive the first control signal; the third transistor is coupled between the circuit node and the fourth transistor, and the current electrode of the third transistor is coupled to receive the first control signal; control electrodes of each of the first and fourth transistors is coupled to receive the third control signal; and the digital output signal is generated by a latch coupled to the circuit node. In yet a further aspect, the latch has a first inverter having an input coupled to the circuit node, and an output configured to provide the digital output signal. In yet an even further aspect, the latch further includes a second inverter having an input coupled to the output of the first inverter, and an output coupled to the circuit node; and an n-channel transistor coupled between the second inverter and the second voltage supply terminal and having a current electrode coupled to receive the first control signal. In another aspect of the above embodiment, the first signal splitter includes a first inverter powered between a first voltage supply terminal and a second voltage supply terminal and having an input coupled to receive the lower signal, wherein the first voltage supply terminal is configured to provide the second voltage level and the second voltage supply terminal is configured to provide the first voltage level; the second signal splitter includes a first inverter powered between a third voltage supply terminal and the second voltage supply terminal and having an input coupled to receive the upper signal, wherein the third voltage supply terminal is configured to provide the third voltage level; and the first control signal is generated from an output of the first inverter of the first signal splitter and the at least one control signal is generated from an output of the first inverter of the second signal splitter. In a further aspect, a trippoint of the first inverter of the first signal splitter is not affected by modification of a trippoint of the first inverter of the second signal splitter, and vice versa. In another further aspect, the first signal splitter comprises at least one additional inverter coupled to the output of the first inverter of the first signal splitter to generate the first control signal; and the second signal splitter comprises at least one additional inverter coupled to the output of the first inverter of the second signal splitter to generate the at least one control signal. In yet another further aspect, the first signal splitter includes a first n-channel transistor having a first current electrode coupled to receive the input voltage, a control electrode coupled to receive a reference voltage, and a second current electrode coupled to the input of the first inverter of the first signal splitter to provide the lower signal; and a second n-channel transistor having a first current electrode coupled to the input of the first inverter of the first signal splitter, a control electrode coupled to receive the input voltage, and a second current electrode coupled to the first voltage supply terminal; and the second signal splitter includes a first p-channel transistor having a first current electrode coupled to the first voltage supply terminal, a control electrode coupled to receive the input voltage, and a second current electrode coupled to the input of the first inverter of the second signal splitter to provide the upper signal; and a second p-channel transistor having a first current electrode coupled to the input of the first inverter of the second signal splitter, a control electrode coupled to receive the reference voltage, and a second current electrode coupled to receive the input voltage. In yet another aspect of the above embodiment, the combiner circuit includes an input stage to logically combine the first and second control signals at a circuit node, wherein the digital output signal is generated based on the circuit node. In a further aspect, the combiner circuit further includes a latch, and the latch includes a first inverter having an input coupled to the first node, and an output configured to provide the digital output signal; a second inverter having an input coupled to the output of the first inverter, and an output coupled to the circuit node; and an n-channel transistor coupled between the second inverter and the second voltage supply terminal and having a current electrode coupled to receive the first control signal. In yet another aspect, the second voltage level is half of the third voltage level. In yet another aspect, the level shifter includes a first p-channel transistor coupled between a first voltage supply terminal configured to provide the third voltage level and a first circuit node, and having a control electrode coupled to receive one of the at least one control signal; a second p-channel transistor coupled between the first voltage supply terminal and a second circuit node, and having a control electrode coupled to receive another one of the at least one control signal; a first n-channel transistor having a first current electrode coupled to the first circuit node, a control electrode coupled to the second circuit node, and a second current electrode code coupled to a second voltage supply terminal configured to provide the first voltage level; and a second n-channel transistor having a first current electrode coupled to the second circuit node, a control electrode coupled to the first circuit node, and a second current electrode coupled to the second voltage supply terminal, wherein the second circuit node provides the second control signal.

In another embodiment, an input circuit is configured to receive an input voltage and generate a digital output, and includes a first signal splitter configured to generate a lower signal which tracks the input voltage in a range of a first voltage level and a second voltage level, and having a first inverter configured to receive the lower signal and generate a first control signal which varies between the first and second voltage levels; a second signal splitter configured to generate an upper signal which tracks the input voltage in a range of the second voltage level and a third voltage level and having a first inverter configured to receive the upper signal and generate a second control signal which varies between the second and third voltage levels, wherein the third voltage level is greater than the second voltage level, and the second level is greater than the first voltage level; a level shifter configured to receive at least one control signal based on the second control signal and provide a third control signal which varies between the first and second voltage levels; a combiner circuit configured to receive the third control signal, receive a fourth control signal based on the first control signal, and generate the digital output as a logical combination of the third and fourth controls signals. In one aspect of the another embodiment, the combiner circuit is coupled between a first voltage supply terminal configured to provide the second voltage level and a second voltage supply terminal configured to provide the first voltage level, the combiner circuit includes a first p-channel transistor having a first current electrode coupled to the first voltage supply terminal; a second p-channel transistor having a first current electrode coupled to a second current electrode of the first p-channel transistor, and a second current electrode coupled to a circuit node; a first n-channel transistor having a first current electrode coupled to the circuit node; and a second n-channel transistor having a first current electrode coupled to a second current electrode of the first n-channel transistor, and a second current electrode coupled to the second voltage supply terminal, wherein control electrodes of the first p-channel transistor and the second n-channel transistor are coupled to receive the third control signal, and control electrodes of the second p-channel transistor and the first n-channel transistor are coupled to receive the fourth control signal, and wherein the digital output signal is generated based on the circuit node. In a further aspect, the combiner circuit further includes a latch, and the latch includes a first inverter having an input coupled to the first node, and an output configured to provide the digital output signal; a second inverter having an input coupled to the output of the first inverter of the latch, and an output coupled to the circuit node; and an n-channel transistor coupled between the second inverter of the latch and the second voltage supply terminal and having a current electrode coupled to receive the fourth control signal. In another aspect of the another embodiment, a trippoint of the first inverter of the first signal splitter is not affected by modification of a trippoint of the first inverter of the second signal splitter, and vice versa. In yet another aspect, the first signal splitter comprises at least one additional inverter coupled to the output of the first inverter of the first signal splitter to generate the fourth control signal; and the second signal splitter comprises at least one additional inverter coupled to the output of the first inverter of the second signal splitter to generate the at least one control signal based on the second control signal for the level shifter.

What is claimed is:

1. An input circuit configured to receive an input voltage and generate a digital output, comprising:
   a first signal splitter configured to generate a lower signal which tracks the input voltage in a range of a first voltage level and a second voltage level and provide a first control signal based on the lower signal;
   a second signal splitter configured to generate an upper signal which tracks the input voltage in a range of the second voltage level and a third voltage level and provide at least one control signal based on the upper signal, wherein the third voltage level is greater than the second voltage level, and the second level is greater than the first voltage level;
   a level shifter configured to receive the at least one control signal from the second signal splitter and provide a third control signal; and
   a combiner circuit configured to generate the digital output as a logical combination of the first and third controls signals, wherein the combiner circuit comprises:
      a first, second, third, and fourth transistors coupled in series between first and second voltage supply terminals, wherein the first voltage supply terminal is configured to provide the second voltage level and the second voltage supply terminal is configured to provide the first voltage level, wherein each of the first, second, third, and fourth transistors is coupled to receive one of the first control signal or the third control signal.

2. The input circuit of claim 1, wherein the first control and the third control signal each vary between the first and second voltage levels, and each of the at least one control signals varies between the second and third voltage levels.

3. The input circuit of claim 1, wherein
   the first and second transistors are coupled between the first voltage supply terminal and a circuit node, wherein the first and second transistors are p-channel transistors, wherein a control electrode of the first transistor is coupled to receive the one of the first control signal or third control signal and a control electrode of the second transistor is configured to receive another one of the first control signal or third control signal;
   the third and fourth transistors are coupled between the circuit node and the second voltage supply terminal, wherein the third and fourth transistors are n-channel transistors, wherein a control electrode of the fourth transistor is coupled to receive the one of the first control signal or third control signal and a control electrode of the third transistor is configured to receive the another one of the first control signal or third control signal; and
   the digital output signal is generated based on the circuit node.

4. The input circuit of claim 3, wherein:
   the second transistor is coupled between the circuit node and the first transistor, and the control electrode of the second transistor is coupled to receive the first control signal;
   the third transistor is coupled between the circuit node and the fourth transistor, and the control electrode of the third transistor is coupled to receive the first control signal;
   control electrodes of each of the first and fourth transistors is coupled to receive the third control signal; and
   the digital output signal is generated by a latch coupled to the circuit node.

5. The input circuit of claim 4, wherein the latch has a first inverter having an input coupled to the circuit node, and an output configured to provide the digital output signal.

6. The input circuit of claim 5, wherein the latch further comprises:

a second inverter having an input coupled to the output of the first inverter, and an output coupled to the circuit node; and an n-channel transistor coupled between the second inverter and the second voltage supply terminal and having a control electrode coupled to receive the first control signal.

7. The input circuit of claim 1, wherein:

the first signal splitter comprises a first inverter powered between a first voltage supply terminal and a second voltage supply terminal and having an input coupled to receive the lower signal, wherein the first voltage supply terminal is configured to provide the second voltage level and the second voltage supply terminal is configured to provide the first voltage level;

the second signal splitter comprises a first inverter powered between a third voltage supply terminal and the first voltage supply terminal and having an input coupled to receive the upper signal, wherein the third voltage supply terminal is configured to provide the third voltage level; and the first control signal is generated from an output of the first inverter of the first signal splitter and the at least one control signal is generated from an output of the first inverter of the second signal splitter.

8. The input circuit of claim 7, wherein a trippoint of the first inverter of the first signal splitter is not affected by modification of a trippoint of the first inverter of the second signal splitter, and vice versa.

9. The input circuit of claim 7, wherein:

the first signal splitter comprises at least one additional inverter coupled to the output of the first inverter of the first signal splitter to generate the first control signal; and the second signal splitter comprises at least one additional inverter coupled to the output of the first inverter of the second signal splitter to generate the at least one control signal.

10. The input circuit of claim 7, wherein:

the first signal splitter comprises:

a first n-channel transistor having a first current electrode coupled to receive the input voltage, a control electrode coupled to receive a reference voltage, and a second current electrode coupled to the input of the first inverter of the first signal splitter to provide the lower signal; and a second n-channel transistor having a first current electrode coupled to the input of the first inverter of the first signal splitter, a control electrode coupled to receive the input voltage, and a second current electrode coupled to the first voltage supply terminal; and the second signal splitter comprises:

a first p-channel transistor having a first current electrode coupled to the first voltage supply terminal, a control electrode coupled to receive the input voltage, and a second current electrode coupled to the input of the first inverter of the second signal splitter to provide the upper signal; and a second p-channel transistor having a first current electrode coupled to the input of the first inverter of the second signal splitter, a control electrode coupled to receive the reference voltage, and a second current electrode coupled to receive the input voltage.

11. The input circuit of claim 1, wherein the combiner circuit comprises:

an input stage to logically combine the first and third control signals at a circuit node, wherein the digital output signal is generated based on the circuit node.

12. The input circuit of claim 11, wherein the combiner circuit further comprises a latch, the latch comprising:

a first inverter having an input coupled to the circuit node, and an output configured to provide the digital output signal;

a second inverter having an input coupled to the output of the first inverter, and an output coupled to the circuit node; and an n-channel transistor coupled between the second inverter and the second voltage supply terminal and having a control electrode coupled to receive the first control signal.

13. The input circuit of claim 1, wherein the second voltage level is half of the third voltage level.

14. An input circuit configured to receive an input voltage and generate a digital output, comprising:

a first signal splitter configured to generate a lower signal which tracks the input voltage in a range of a first voltage level and a second voltage level and provide a first control signal based on the lower signal;

a second signal splitter configured to generate an upper signal which tracks the input voltage in a range of the second voltage level and a third voltage level and provide at least one control signal based on the upper signal, wherein the third voltage level is greater than the second voltage level, and the second level is greater than the first voltage level;

a level shifter configured to receive the at least one control signal from the second signal splitter and provide a third control signal; and a combiner circuit configured to generate the digital output as a logical combination of the first and third controls signals, wherein the level shifter comprises:

a first p-channel transistor coupled between a first voltage supply terminal configured to provide the third voltage level and a first circuit node, and having a control electrode coupled to receive one of the at least one control signal;

a second p-channel transistor coupled between the first voltage supply terminal and a second circuit node, and having a control electrode coupled to receive another one of the at least one control signal;

a first n-channel transistor having a first current electrode coupled to the first circuit node, a control electrode coupled to the second circuit node, and a second current electrode code coupled to a second voltage supply terminal configured to provide the first voltage level; and a second n-channel transistor having a first current electrode coupled to the second circuit node, a control electrode coupled to the first circuit node, and a second current electrode coupled to the second voltage supply terminal, wherein the second circuit node provides the second control signal.

15. The input circuit of claim 14, wherein the first control and the third control signal each vary between the first and second voltage levels, and each of the at least one control signals varies between the second and third voltage levels.

16. The input circuit of claim 14, wherein:

the first signal splitter comprises a first inverter powered between a first voltage supply terminal and a second voltage supply terminal and having an input coupled to receive the lower signal, wherein the first voltage supply terminal is configured to provide the second voltage level and the second voltage supply terminal is configured to provide the first voltage level;

the second signal splitter comprises a first inverter powered between a third voltage supply terminal and the first voltage supply terminal and having an input coupled to receive the upper signal, wherein the third voltage supply terminal is configured to provide the third voltage level; and the first control signal is generated from an output of the first inverter of the first signal splitter and the at least one control signal is generated from an output of the first inverter of the second signal splitter.

17. The input circuit of claim 14, wherein the combiner circuit comprises:

an input stage to logically combine the first and third control signals at a circuit node, wherein the digital output signal is generated based on the circuit node.

18. An input circuit configured to receive an input voltage and generate a digital output, comprising:

a first signal splitter configured to generate a lower signal which tracks the input voltage in a range of a first voltage level and a second voltage level, and having a first inverter configured to receive the lower signal and generate a first control signal which varies between the first and second voltage levels;

a second signal splitter configured to generate an upper signal which tracks the input voltage in a range of the second voltage level and a third voltage level and having a first inverter configured to receive the upper signal and generate a second control signal which varies between the second and third voltage levels, wherein the third voltage level is greater than the second voltage level, and the second level is greater than the first voltage level;

a level shifter configured to receive at least one control signal based on the second control signal and provide a third control signal which varies between the first and second voltage levels; and a combiner circuit configured to receive the third control signal, receive a fourth control signal based on the first control signal, and generate the digital output as a logical combination of the third and fourth controls signals, wherein the combiner circuit is coupled between a first voltage supply terminal configured to provide the second voltage level and a second voltage supply terminal configured to provide the first voltage level, the combiner circuit comprising:

a first p-channel transistor having a first current electrode coupled to the first voltage supply terminal;

a second p-channel transistor having a first current electrode coupled to a second current electrode of the first p-channel transistor, and a second current electrode coupled to a circuit node;

a first n-channel transistor having a first current electrode coupled to the circuit node; and a second n-channel transistor having a first current electrode coupled to a second current electrode of the first n-channel transistor, and a second current electrode coupled to the second voltage supply terminal, wherein control electrodes of the first p-channel transistor and the second n-channel transistor are coupled to receive the third control signal, and control electrodes of the second p-channel transistor and the first n-channel transistor are coupled to receive the fourth control signal, and wherein the digital output signal is generated based on the circuit node.

19. The input circuit of claim 18, wherein the combiner circuit further comprises a latch, the latch comprising:

a first inverter having an input coupled to the circuit node, and an output configured to provide the digital output signal;

a second inverter having an input coupled to the output of the first inverter of the latch, and an output coupled to the circuit node; and an n-channel transistor coupled between the second inverter of the latch and the second voltage supply terminal and having a control electrode coupled to receive the fourth control signal.

20. The input circuit of claim 18, wherein a trippoint of the first inverter of the first signal splitter is not affected by modification of a trippoint of the first inverter of the second signal splitter, and vice versa.

21. An input circuit configured to receive an input voltage and generate a digital output, comprising:

a first signal splitter configured to generate a lower signal which tracks the input voltage in a range of a first voltage level and a second voltage level, and having a first inverter configured to receive the lower signal and generate a first control signal which varies between the first and second voltage levels;

a second signal splitter configured to generate an upper signal which tracks the input voltage in a range of the second voltage level and a third voltage level and having a first inverter configured to receive the upper signal and generate a second control signal which varies between the second and third voltage levels, wherein the third voltage level is greater than the second voltage level, and the second level is greater than the first voltage level;

a level shifter configured to receive at least one control signal based on the second control signal and provide a third control signal which varies between the first and second voltage levels; and a combiner circuit configured to receive the third control signal, receive a fourth control signal based on the first control signal, and generate the digital output as a logical combination of the third and fourth controls signals, wherein:

the first signal splitter comprises at least one additional inverter coupled to the output of the first inverter of the first signal splitter to generate the fourth control signal; and the second signal splitter comprises at least one additional inverter coupled to the output of the first inverter of the second signal splitter to generate the at least one control signal based on the second control signal for the level shifter.

22. The input circuit of claim 21, wherein a trippoint of the first inverter of the first signal splitter is not affected by modification of a trippoint of the first inverter of the second signal splitter, and vice versa.

* * * * *